(12) United States Patent
Kuo et al.

(10) Patent No.: US 12,696,463 B2
(45) Date of Patent: Jul. 28, 2026

(54) INTEGRATED CIRCUIT WITH THIN FILM RESISTER STRUCTURE

(71) Applicant: Taiwan Semiconductor Manufacturing Company, Ltd., Hsinchu (TW)

(72) Inventors: Chun-Tsung Kuo, Tainan (TW); Ming Chyi Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 883 days.

(21) Appl. No.: 17/817,366

(22) Filed: Aug. 4, 2022

(65) Prior Publication Data

US 2024/0047510 A1     Feb. 8, 2024

(51) Int. Cl.
| | |
|---|---|
| *H10D 1/47* | (2025.01) |
| *H10W 72/00* | (2026.01) |
| *H10W 72/90* | (2026.01) |

(52) U.S. Cl.
CPC ...... *H10D 1/474* (2025.01); *H10W 72/01951* (2026.01); *H10W 72/01953* (2026.01); *H10W 72/923* (2026.01); *H10W 72/931* (2026.01); *H10W 72/932* (2026.01); *H10W 72/934* (2026.01); *H10W 72/952* (2026.01)

(58) Field of Classification Search
None
See application file for complete search history.

(56) References Cited

U.S. PATENT DOCUMENTS

| | | | | |
|---|---|---|---|---|
| 5,210,438 | A * | 5/1993 | Nakamura ......... | H10D 30/0314 257/536 |
| 5,420,063 | A * | 5/1995 | Maghsoudnia ... | H01L 21/32134 257/E21.309 |
| 5,420,071 | A * | 5/1995 | Burke ............... | H01L 21/76895 257/E21.59 |
| 6,165,861 | A * | 12/2000 | Liu ...................... | H10D 84/209 257/E27.047 |
| 6,326,256 | B1 * | 12/2001 | Bailey ............... | H01L 21/76894 438/383 |
| 10,157,867 | B1 * | 12/2018 | Chen ................. | H01L 23/53233 |
| 2002/0115299 | A1 * | 8/2002 | Ito ..................... | H01L 21/32139 257/E21.314 |
| 2003/0030107 | A1 * | 2/2003 | Zekeriya ............ | H01L 23/5228 257/E21.508 |

(Continued)

*Primary Examiner* — Jessica S Manno
*Assistant Examiner* — Christopher A. Schodde
(74) *Attorney, Agent, or Firm* — Ingrassia Fisher & Lorenz, LLP | IF&L

(57) ABSTRACT

A fabrication method includes: forming, over a first dielectric layer between a first metal portion and a second metal portion, a thin film resistor (TFR); forming openings in the first dielectric layer over the first metal portion and the second metal portion; and forming a first bond pad in an opening over the first metal portion and a second bond pad in an opening over the second metal portion; wherein the first dielectric layer is disposed between the first bond pad and the second bond pad, the TFR is formed over the first dielectric layer between the first bond pad and the second bond pad, the TFR has an electrical connection at a first end to the first bond pad and an electrical connection at a second end to the second bond pad, and the TFR provides a resistive path between the first bond pad and the second bond path.

20 Claims, 9 Drawing Sheets

(56) References Cited

U.S. PATENT DOCUMENTS

| | | | |
|---|---|---|---|
| 2005/0003673 A1* | 1/2005 | Mahdavi | H01J 37/32082 |
| | | | 257/E21.311 |
| 2005/0040494 A1* | 2/2005 | Huttemann | H01C 17/08 |
| | | | 257/E27.047 |
| 2007/0008062 A1* | 1/2007 | Fivas | H01C 7/006 |
| | | | 257/E21.004 |
| 2011/0291266 A1* | 12/2011 | Jin | H01L 23/481 |
| | | | 257/737 |
| 2014/0083975 A1* | 3/2014 | Yoshida | H01J 37/32155 |
| | | | 216/41 |
| 2014/0184381 A1* | 7/2014 | Hao | H01C 17/06 |
| | | | 29/25.42 |
| 2015/0069574 A1* | 3/2015 | Tseng | H01L 21/707 |
| | | | 438/384 |
| 2021/0391302 A1* | 12/2021 | Kao | H01L 23/53228 |

* cited by examiner

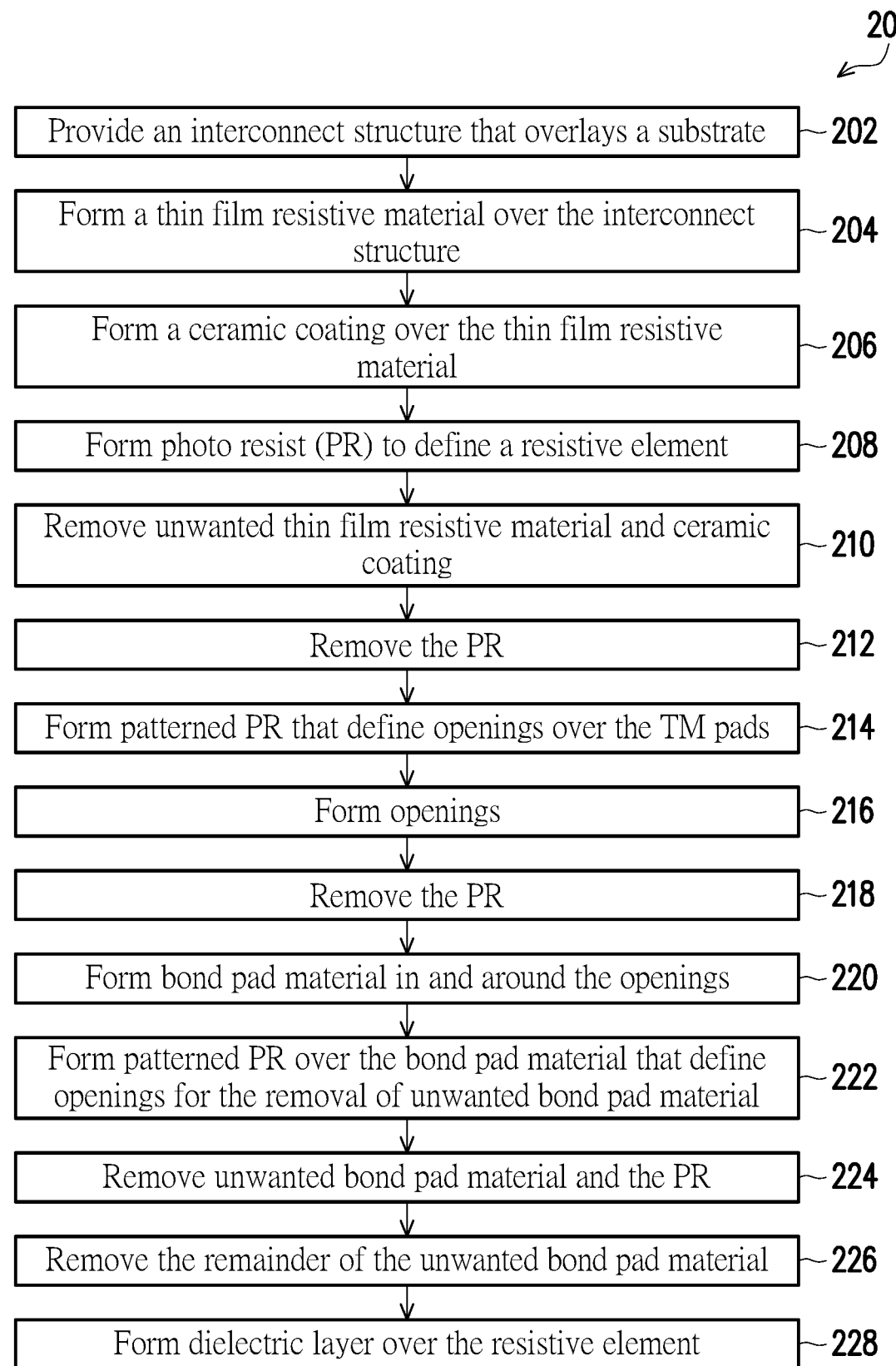

200

Provide an interconnect structure that overlays a substrate ─ 202

Form a thin film resistive material over the interconnect structure ─ 204

Form a ceramic coating over the thin film resistive material ─ 206

Form photo resist (PR) to define a resistive element ─ 208

Remove unwanted thin film resistive material and ceramic coating ─ 210

Remove the PR ─ 212

Form patterned PR that define openings over the TM pads ─ 214

Form openings ─ 216

Remove the PR ─ 218

Form bond pad material in and around the openings ─ 220

Form patterned PR over the bond pad material that define openings for the removal of unwanted bond pad material ─ 222

Remove unwanted bond pad material and the PR ─ 224

Remove the remainder of the unwanted bond pad material ─ 226

Form dielectric layer over the resistive element ─ 228

FIG. 2

INTEGRATED CIRCUIT WITH THIN FILM RESISTER STRUCTURE

BACKGROUND

Thin film resistors (TFRs) are very useful for high precision analog and mixed signal applications, and have been utilized in electronic circuits of many technological applications. The TFRs may be part of an individual device, or may be part of a complex hybrid circuit or integrated circuit.

Conventional methods for integrating a thin film resistor into an integrated circuit can add a plurality of additional lithography steps plus additional process steps. This can add considerable expense and cycle time to the manufacturing flow. Consequently, there are many challenges to forming TFRs in an integrated circuit design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flowchart depicting an example method of integrated circuit fabrication including forming a TFR, in accordance with some embodiments;

DETAILED DESCRIPTION

Figure 1A:
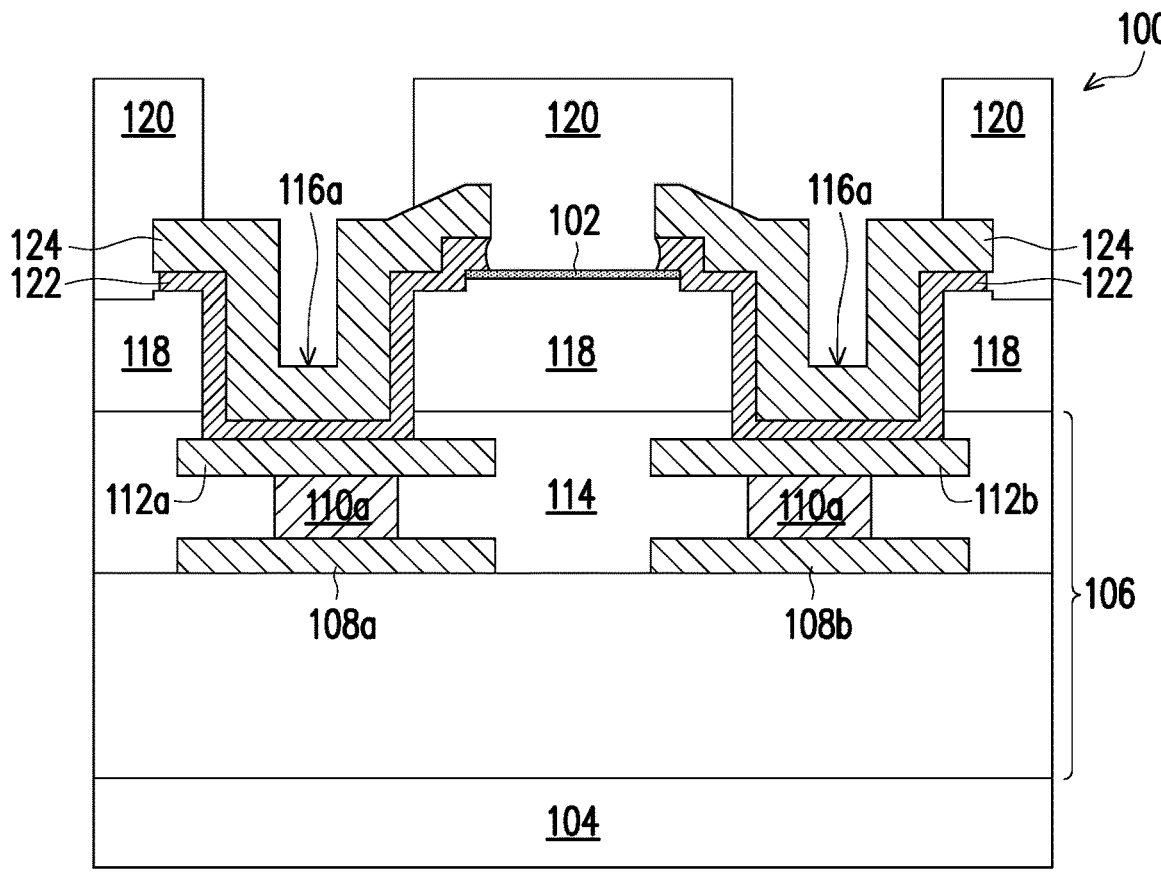
FIG. 1A is a schematic view of a portion of an integrated circuit that includes a TFR, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Throughout the description herein, unless otherwise specified, the same reference numeral in different figures refers to the same or similar component formed by a same or similar method using a same or similar material(s).

FIG. 1A is a schematic view of a portion of an integrated circuit 100 that includes a thin film resistor (TFR) 102 according to various embodiments of the present disclosure. Note that for clarity, not all features of the integrated circuit 100 are illustrated in FIG. 1A and FIG. 1A may illustrate only a portion of the integrated circuit 100 formed. The integrated circuit 100 includes a semiconductor substrate 104 and an interconnect structure 106 that overlies the substrate 104.

The TFR 102 overlies the interconnect structure 106. In some embodiments, the TFR 102 may, for example, be used in RC circuits, power drivers, power amplifiers, RF applications, analog to digital converters (ADCs), and/or digital to analog converters (DACs).

Figure 1B:
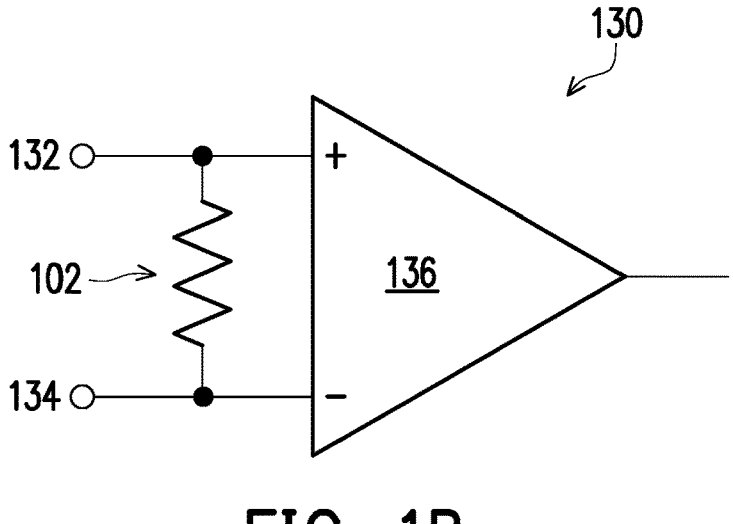
FIG. 1B is a schematic diagram depicting an example circuit in which a TFR may be used, in accordance with some embodiments.

FIG. 1B is a schematic diagram depicting an example circuit 130 in which the TFR 102 may be used. In this example, the TFR 102 is formed across input terminals 132 and 134 to an amplifier structure 136.

Referring back to FIG. 1A, the substrate 104 may be a semiconductor substrate, such as a bulk semiconductor, a semiconductor-on-insulator (SOI) substrate, a semiconductor wafer, or the like, which may be doped (e.g., with a p-type or an n-type dopant) or undoped. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The semiconductor substrate 104 can include any number of conductive features and device elements formed in and/or over the semiconductor substrate. Conductive features can include, for example, plugs, interconnects, wiring lines, etc. Device elements can include, for example, transistors, diodes, capacitors, etc. For example, the transistors may be metal oxide semiconductor field effect transistors (MOSFETs), complementary metal oxide semiconductor (CMOS) transistors, bipolar junction transistors (BJT), high-voltage transistors, high-frequency transistors, p-channel field effect transistors (PFETs) and/or n-channel field effect transistors (NFETs), etc.

The interconnect structure 106 provides routing and electrical connections between devices elements formed in and/or over the semiconductor substrate 104. The interconnect structure 106 may include a plurality of insulating layers, which may be inter-metal dielectric (IMD) layers. Each of the insulating layers includes one or more conductive features, which may be metal lines and/or vias formed therein in a metallization layer. The conductive features may be electrically connected to active and/or passive devices of the substrate 104 by contacts (not shown in the figures). Some portions of the conductive features formed in the topmost insulating layer of the interconnect structure 106 may be formed having a relatively larger area than the other conductive features within the interconnect structure 106. The conductive features of the interconnect structure 106 that are formed in the topmost insulating layer are separately labeled as metal pads 112a and 112b. The metal pads 112a may be utilized for connecting subsequently formed conductive features (e.g., bond pad 116a and 116b) to the interconnect structure 106. In some embodiments, the conductive features of the topmost insulating layer may also comprise metal lines or vias, which are not separately shown in FIG. 1A.

In some embodiments, the interconnect structure 106 may be formed using a single and/or a dual damascene process, a via-first process, or a metal-first process. In an embodiment, insulating layers and openings (not shown) may be formed therein using acceptable photolithography and etching techniques. Diffusion barrier layers (not shown) may be formed in the openings and may include a material such as TaN, Ta, TiN, Ti, CoW, or the like, and may be formed in the openings using a deposition process such as CVD, Atomic Layer Deposition (ALD), or the like. A conductive material may be formed in the openings from copper, aluminum, nickel, tungsten, cobalt, silver, combinations thereof, or the like, and may be formed over the diffusion barrier layers in the openings using an electro-chemical plating process, CVD, ALD, PVD, the like, or a combination thereof. After formation of the conductive material, excess conductive material may be removed using, for example, a planarization process such as CMP, thereby leaving conductive features in the openings of an insulating layer. The process may then be repeated to form additional insulating layers and conductive features therein.

A plurality of conductive features including inter metal layer (IME) lines 108a and 108b, top via layer (TVA) vias 110a and 110b, and top metal layer (TM) pads 112a and 112b, are illustrated in the example interconnect structure 106. An IMD layer 114 is also illustrated in the example interconnect structure 106. The example IMD layer 114 may, for example, be or comprise an oxide film, such as undoped silicon glass (USG), fluorosilicate glass (FSG), boron doped silicate glass (BSG), phosphosilicate glass (PSG), boron phosphorous-doped silicate glass (BPSG), polyethylene oxide (PEOX), thermal oxide, silicon dioxide ($SiO_2$), or another suitable dielectric material.

The integrated circuit 100 further includes a dielectric layer 118 over the IMD layer 114, also includes bond pads 116a and 116b formed in openings in the dielectric layer 118 to underlying metal pads 112a and 112b, and further includes a protective dielectric layer 120 over the TFR 102 and the dielectric layer 118. The bond pads 116a and 116b may be used as test points and/or connection points for packaging connections for the integrated circuit 100. The example dielectric layer 118 and/or the protective dielectric layer 120 may, for example, be or comprise an oxide film, such as undoped silicon glass (USG), fluorosilicate glass (FSG), boron doped silicate glass (BSG), phosphosilicate glass (PSG), boron phosphorous-doped silicate glass (BPSG), polyethylene oxide (PEOX), thermal oxide, silicon dioxide ($SiO_2$), or another suitable dielectric material. In various embodiments, the bond pads 116a and 116b includes a titanium nitride (TiN) layer 122 and an aluminum copper (AlCu) layer 124.

The TFR 102 is electrically connected between the bond pads 116a and 116b. The TFR 102 includes a thin film resistor material, such as silicon chromium (SiCr). Alternatively, the TFR 102 may include other suitable resistive materials, such as nickel chromium (NiCr) or tantalum nitride (TaN). The material of the TFR 102 can be selected based on the resistor properties desired. The TFR 102 has a thickness of about 10 A to about 1,000 A. The TFR 102 is formed by a suitable process, such as CVD, PVD, ALD, HDPCVD, MOCVD, RPCVD, PECVD, PLD, other suitable techniques, or combinations thereof.

FIG. 2 is a flowchart depicting an example method 200 of integrated circuit fabrication including forming a TFR, in accordance with some embodiments. The method 200 is merely an example and is not intended to limit the present disclosure beyond what is explicitly recited in the claims. Additional steps may be provided before, during, and after method 200, and some of the steps described can be moved, replaced, or eliminated for additional embodiments of method 200. Additional features may be added in the integrated circuit depicted in the figures, and some of the features described below can be replaced, modified, or eliminated in other embodiments.

The example method 200 can simplify the fabrication of TFRs by reducing the number of masks and patterning processes utilized during fabrication. The example method 200 can provide the advantage of forming a TFR with only one additional mask as compared to conventional techniques for forming TFRs which use two or more mask and patterning processes. The example method 200 can be inserted in a bond pad formation process to form a TFR between bond pads.

Figure 3A:
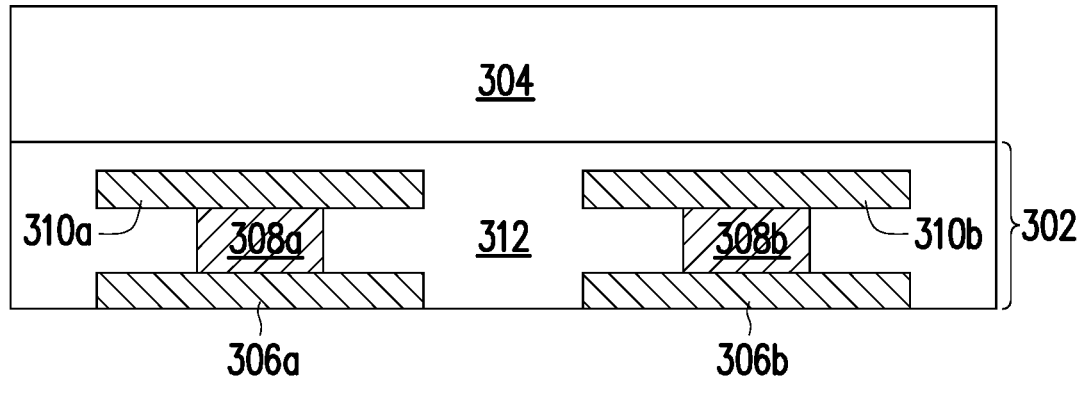
FIGS. 3A, 3B, 3C, 3E, 3F, 3H, 3I, 3J, 3L, and 3N are diagrams depicting cross-sectional views of a portion of an integrated circuit at intermediate fabrication stages, in accordance with some embodiments.
Figure 3B:
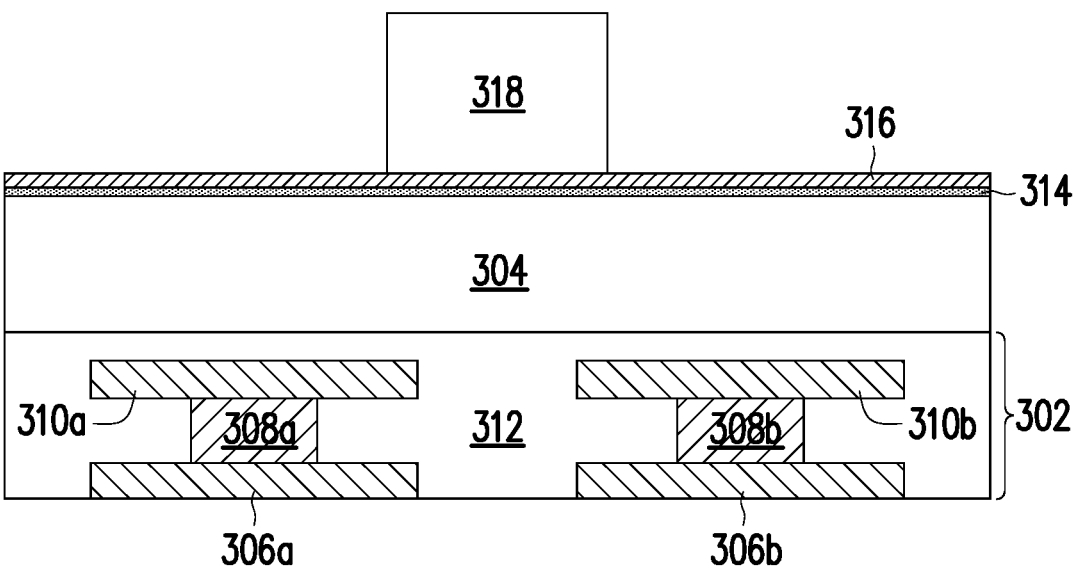
Figure 3C:
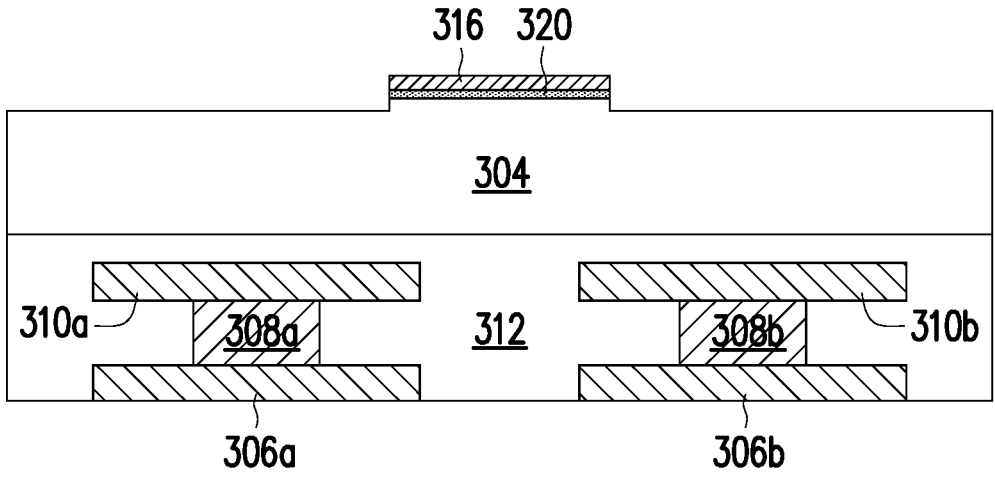
Figure 3D:
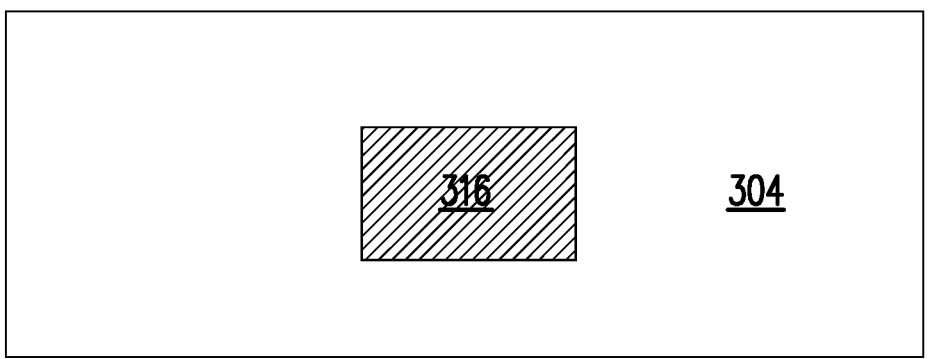
FIGS. 3D, 3G, 3K, and 3M are diagrams depicting top views of a portion of an integrated circuit at intermediate fabrication stages.
Figure 3E:
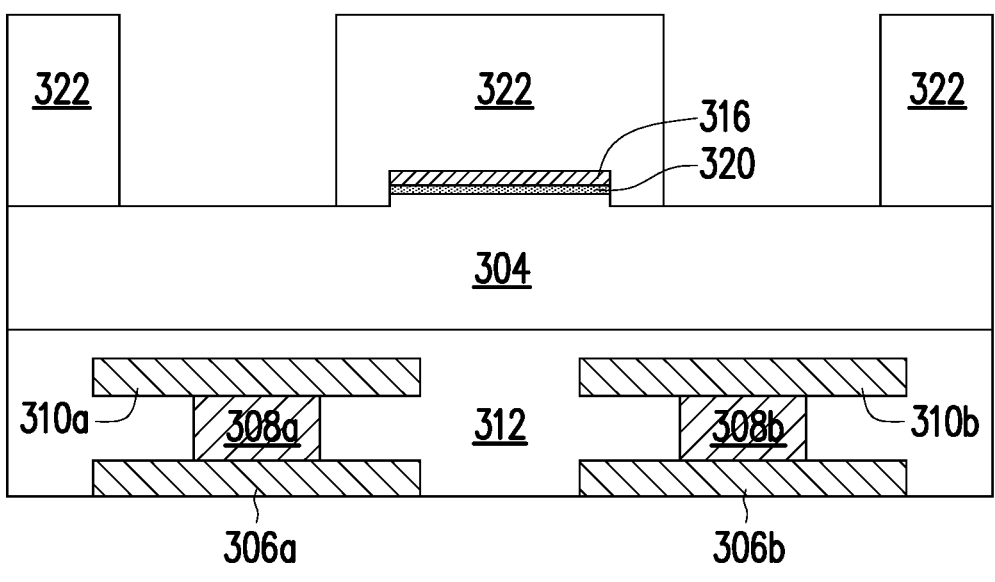
Figure 3F:
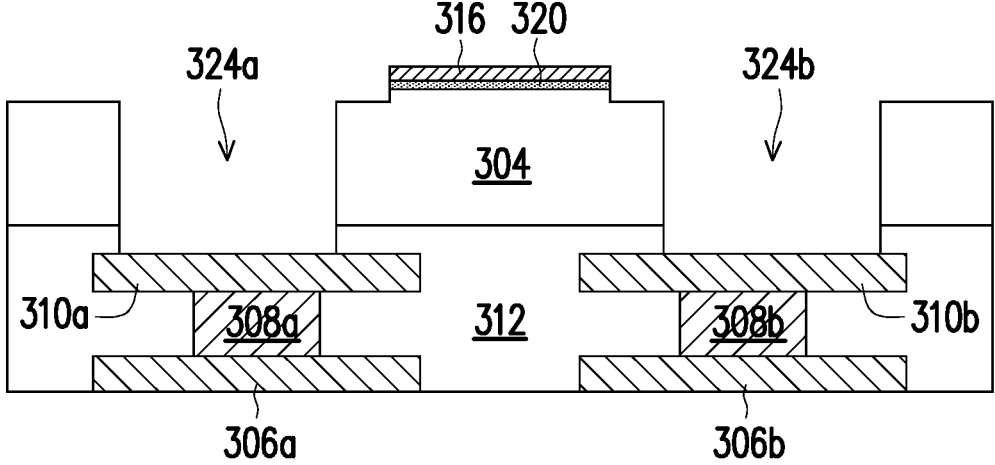
Figure 3G:
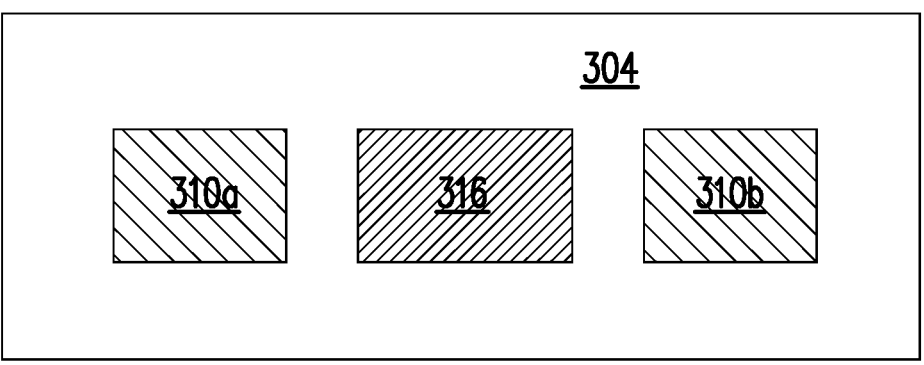
Figure 3H:
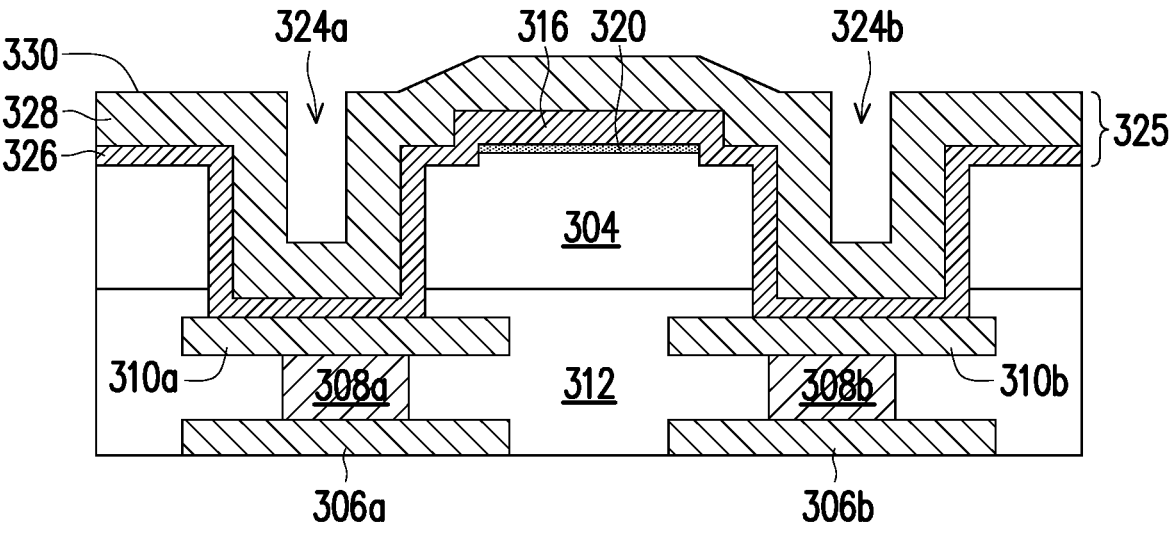
Figures 3I, 3J:
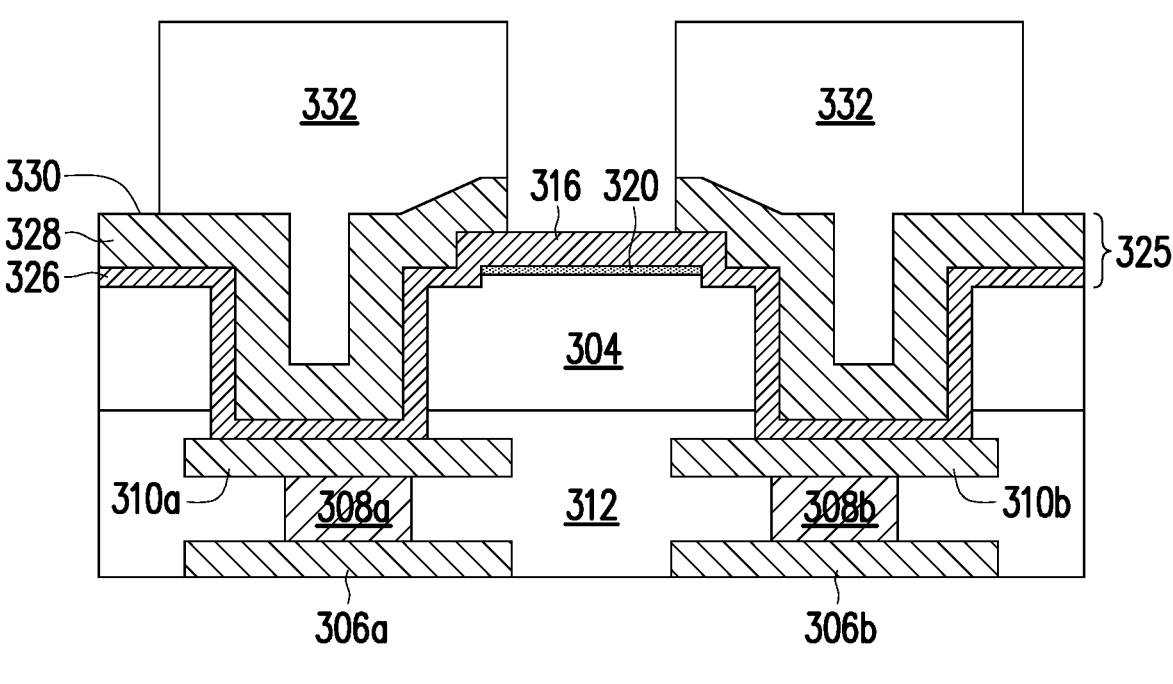
Figure 3K:
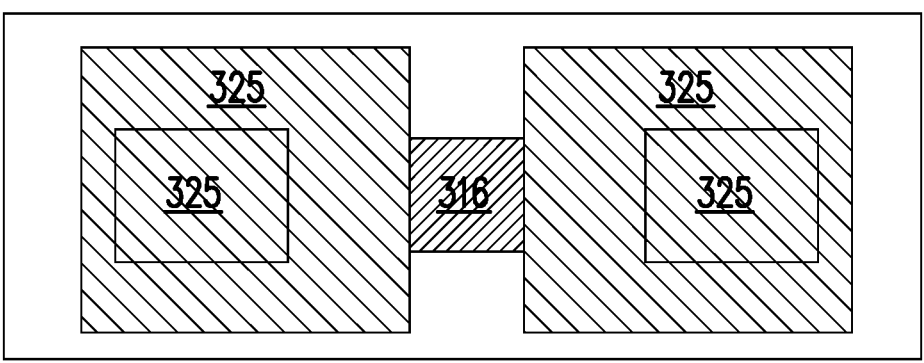
Figure 3L:
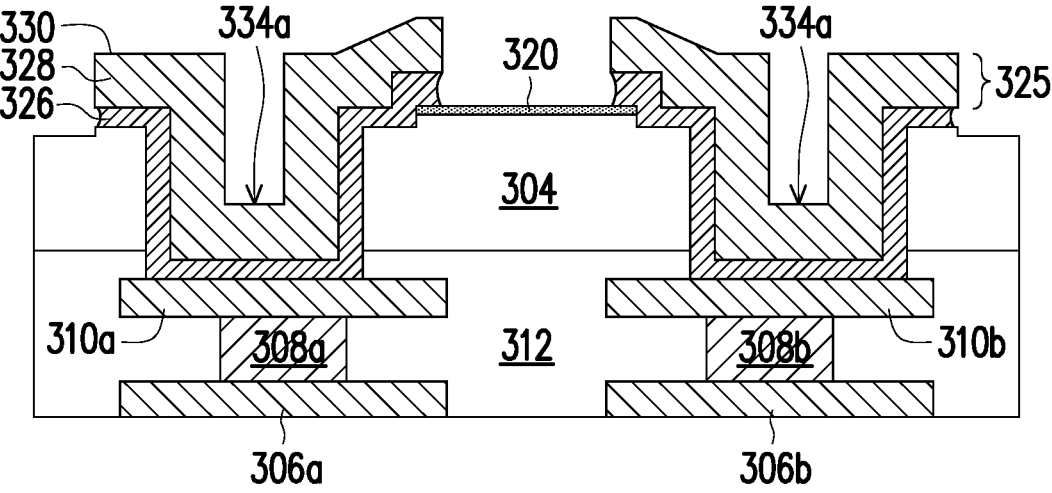
Figure 3M:
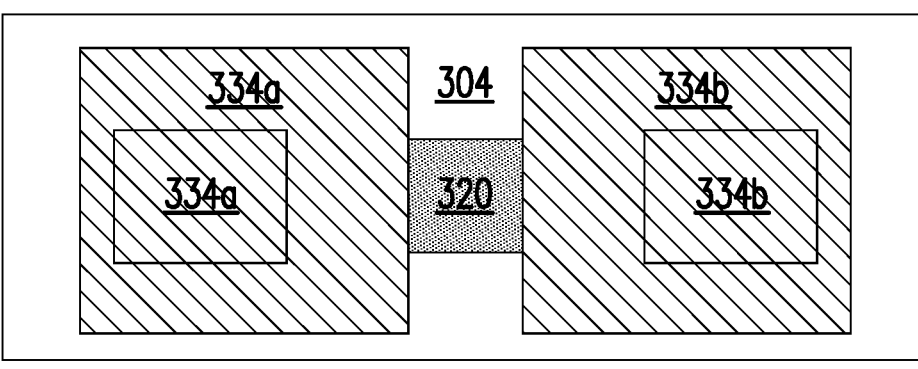
Figure 3N:
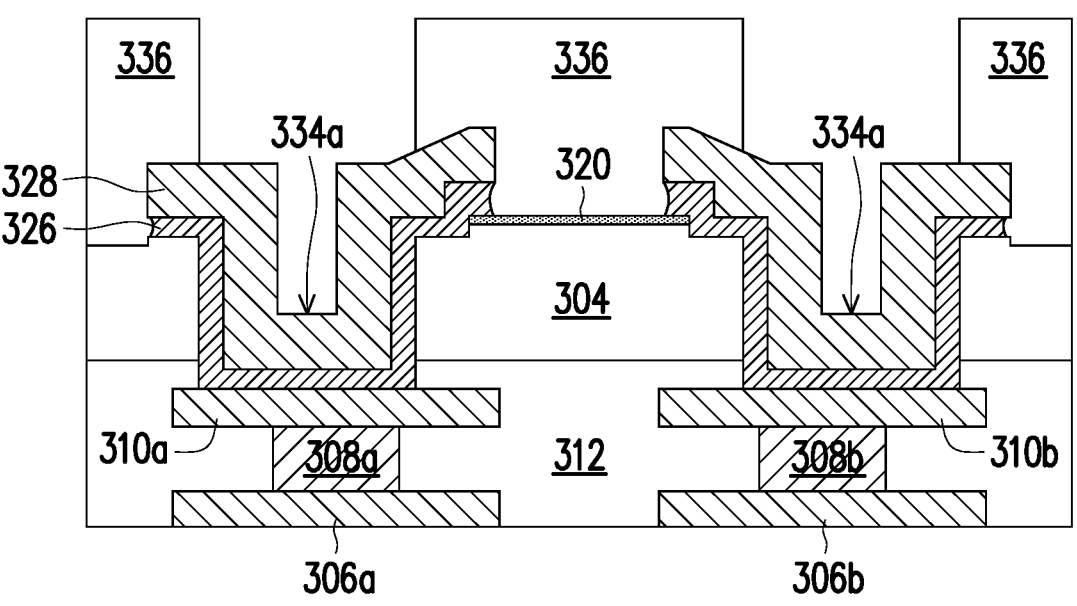

FIG. 2 is described in conjunction with FIGS. 3A-3N, wherein FIGS. 3A-3N are diagrams depicting intermediate stages in the formation of a TFR and bond pads in an integrated circuit, in accordance with various embodiments of the disclosure. In particular, FIGS. 3A, 3B, 3C, 3E, 3F, 3H, 3I, 3J, 3L, and 3N depict cross-sectional views of a portion of an integrated circuit at intermediate fabrication stages and FIGS. 3D, 3G, 3K, and 3M depict top views of the integrated circuit at intermediate fabrication stages.

As with the other method embodiments and exemplary devices discussed herein, it is understood that parts of the integrated circuit may be fabricated by typical semiconductor technology process flow, and thus some processes are only briefly described herein. Further, the exemplary integrated circuit may include various other devices and features, but is simplified for better understanding of concepts of the present disclosure. Moreover, it is noted that the process steps of method 200, including any descriptions given with reference to the figures, as with the remainder of the method and exemplary figures provided in this disclosure, are merely exemplary and are not intended to be limiting beyond what is specifically recited in the claims that follow.

At block 202, the example method 200 includes providing an interconnect structure that overlays a substrate. Referring to the example of FIG. 3A, in an embodiment of block 202, a portion of an interconnect structure 302 with an overlying dielectric layer 304 is provided. The depicted portion of the interconnect structure 302 includes IME lines 306a and 306b, TVA vias 308a and 308b, TM pads 310a and 310b, and IMD layer 312.

The example method 200 includes forming, at block 204, a thin film resistive material, such as SiCr, over the interconnect structure, forming, at block 206, a ceramic coating, such as TiN over the thin film resistive material, and forming, at block 208, photo resist (PR) over a portion of the thin film resistive material to pattern a desired TFR. The thin film resistive material may include silicon chromium (SiCr), nickel chromium (NiCr), tantalum nitride (TaN), or other suitable resistive materials and may be formed over the interconnect structure through a deposition process such as physical vapor deposition (PVD). The ceramic coating may include titanium nitride (TiN) and may be formed over the thin film resistive material through a deposition process such as physical vapor deposition (PVD). The PR may be deposited and patterned using suitable deposition and patterning techniques.

Referring to the example of FIG. 3B, in an embodiment after completion of blocks 204, 206, and 208, thin film resistive material 314 such as SiCr is disposed over the interconnect structure, a ceramic coating 316 such as TiN is disposed over the thin film resistive material, photo resist (PR) 318 is disposed over a portion of the thin film resistive material that is desired for use as a TFR. The PR 318 is the only mask layer used for forming the TFR and defines the dimensions of the TFR.

At block 210, the example method 200 includes removing the unwanted thin film resistive material and the ceramic coating. The unwanted thin film resistive material is the portion of the thin film resistive material that does not underly the PR. The unwanted thin film resistive material and the ceramic coating may be removed by etching operations such as dry etch operations. The dry etch operations may result in the removal of a portion of the overlying dielectric layer.

At block 212, the example method 200 includes removing the PR above the ceramic material. The PR may be removed by suitable removal techniques. Referring to the example of FIGS. 3C and 3D, in an embodiment after completion of block 212, thin film resistor 320 is disposed over the overlying dielectric layer 304, and a portion of the ceramic coating 316 is disposed over the thin film resistor 320.

At block 214, the example method 200 includes forming patterned PR over the overlying dielectric layer that define openings over the TM pads to define desired openings for bond pads. The PR may be deposited and patterned using suitable deposition and patterning techniques to define desired openings for bond pads. Referring to the example of FIG. 3E, in an embodiment after completion of block 214, patterned PR 322 is disposed over the overlying dielectric layer 304.

At block 216, the example method 200 includes forming openings in the overlying dielectric layer 304 and the IMD layer 312 and, at block 218, removing the PR. The openings may be formed using suitable etching techniques such as using plasma for a dry etch process. Referring to the examples of FIGS. 3F and 3G, in an embodiment after completion of block 218, openings 324a and 324b are formed in the overlying dielectric layer 304 and the IMD layer 312 to expose the TM pads 310a and 310b.

At block 220, the example method 200 includes forming bond pad material in and around the openings. The bond pad material may be formed by depositing a first ceramic coating such as TiN, a metal material such as AlCu over the first ceramic coating, and a second ceramic coating such as SiON over the metal material. The first ceramic coating may be deposited by PVD, the metal material may be deposited by PVD, and the second ceramic coating may be deposited by CVD.

Referring to the example of FIG. 3H, in an embodiment after completion of block 220, bond pad material 325 comprising a first ceramic coating 326, metal material 328, and a second ceramic coating 330 are deposited in and around the openings 324a and 324b. In particular, the first ceramic coating 326 is deposited in and around the openings 324a and 324b, the metal material 328 is deposited over the first ceramic coating 326, and the second ceramic coating 330 is deposited over the metal material 328.

At block 222, the example method 200 includes forming patterned PR over the bond pad material that define openings for the removal of unwanted bond pad material. The PR may be deposited and patterned using suitable deposition and patterning techniques to define openings for the removal of unwanted bond pad material. Referring to the example of FIG. 3I, in an embodiment after completion of block 222, patterned PR 332 is disposed over the bond pad material 325.

At block 224, the example method 200 includes removing unwanted bond pad material, including bond pad material above the TFR, and removing the PR. Unwanted bond pad material may be removed by dry etching processes. Referring to the examples of FIGS. 3J and 3K, in an embodiment after completion of block 224, unwanted bond pad material 325 including bond material above the TFR 320 has been removed. The dry etching processes may result in the unwanted metal material 328 and the unwanted second ceramic coating 330 being completely removed and some of the unwanted first ceramic coating 326 being removed.

At block 226, the example method 200 includes removing the remainder of the unwanted bond pad material including bond pad material above the TFR. The remaining unwanted bond pad material above the TFR may be removed by a wet etching process. Referring to the examples of FIGS. 3L and 3M, in an embodiment after completion of block 226, the remaining unwanted bond pad material 325 has been removed leaving the thin film resistor 320 disposed between two bond pads 334a and 334b. The dry etching processes may result in the second ceramic coating 330 being completely removed from above the TFR 320.

At block 228, the example method 200 includes forming a final dielectric layer over the TFR and the overlaying dielectric. The final dielectric layer may be formed by operations including deposition of an oxide film over the structure, depositing and patterning PR over the bond pads, etching away unwanted oxide film, and removing the PR. Referring to the example of FIG. 3N, in an embodiment after completion of block 228, the integrated circuit with a TFR 320 disposed between two bond pads 334a and 334b and a final dielectric layer 336 deposited over the TFR 320 is provided.

In various embodiments, an integrated circuit is disclosed. The integrated circuit includes: a substrate; an interconnect structure overlying the substrate wherein the interconnect structure includes a first metal portion and a second metal portion in a top layer of the interconnect structure; a first bond pad disposed over the first metal portion; a second bond pad disposed over the second metal portion; a first dielectric layer disposed between the first bond pad and the second bond pad; and a thin film resistor (TFR) formed over the first dielectric layer between the first bond pad and the second bond pad.

In certain embodiments of the integrated circuit, the TFR is positioned higher than bottoms of the first bond pad and the second bond pad.

In certain embodiments of the integrated circuit, the first bond pad and the second bond pad each contain a ceramic layer and a metal layer that overlays the ceramic layer and wherein the TFR electrically connects at a first end to the first bond pad via the ceramic layer of the first bond pad and electrically connects at a second end to the second bond pad via the ceramic layer of the second bond pad.

In certain embodiments of the integrated circuit, the ceramic layer is formed from titanium nitride (TiN) and the metal layer is formed from aluminum copper (AlCu).

In certain embodiments of the integrated circuit, the TFR is formed from silicon chromium (SiCr), the ceramic layer is formed from titanium nitride (TiN), and the metal layer is formed from aluminum copper (AlCu).

In certain embodiments of the integrated circuit, the first bond pad is formed over a first end of the TFR and the second bond pad is formed over a second end of the TFR.

In certain embodiments of the integrated circuit, the first metal portion and the second metal portion are each formed in a second dielectric layer; the first dielectric layer is formed above the second dielectric layer; and a third dielectric layer is formed above the TFR and the first dielectric layer.

In various embodiments, a semiconductor fabrication method is provided. The method includes: forming thin film resistive material over a first dielectric layer that overlays an interconnect structure that overlays a substrate; forming a ceramic coating over the thin film resistive material; forming a patterned photo resist (PR) layer over a portion of the ceramic coating and thin film resistive material between a first metal portion and second metal portion; patterning the thin film resistive material and the ceramic coating to form a thin film resistor (TFR) and a patterned ceramic coating overlying the TFR; removing the PR layer; forming openings in the first dielectric layer over the first metal portion and the second metal portion; forming bond pad material over the first dielectric layer, the first metal portion and the second metal portion; and removing the bond pad material and the patterned ceramic coating overlying the TFR. As a result, a first bond pad is disposed over the first metal portion, a second bond pad is disposed over the second metal portion, the first dielectric layer is disposed between the first bond pad and the second bond pad, and the TFR is formed over the first dielectric layer between the first bond pad and the second bond pad.

In certain embodiments of the method, the TFR is positioned higher than bottoms of the first bond pad and the second bond pad.

In certain embodiments of the method, the first bond pad and the second bond pad each contain a ceramic layer and a metal layer that overlays the ceramic layer and wherein the TFR electrically connects at a first end to the first bond pad via the ceramic layer of the first bond pad and electrically connects at a second end to the second bond pad via the ceramic layer of the second bond pad.

In certain embodiments of the method, the TFR is formed from silicon chromium (SiCr), the ceramic layer is formed from titanium nitride (TiN) and the metal layer is formed from aluminum copper (AlCu).

In certain embodiments the method further includes forming a second dielectric layer above the TFR and the first dielectric layer.

In certain embodiments of the method, removing the bond pad material and the ceramic coating overlying the TFR includes: forming a patterned second PR that defines an opening above the TFR for removing bond pad material; performing dry etching operations to remove bond pad material above the TFR; performing wet etching operations to remove ceramic material above the TFR; and removing the second PR.

In certain embodiments of the method, forming openings in the first dielectric layer over the first metal portion and the second metal portion includes: forming a patterned third PR that defines openings in the first dielectric layer over the first metal portion and the second metal portion; performing dry etching operations to remove dielectric material above the first metal portion and the second metal portion; and removing the third PR.

In various embodiments a semiconductor fabrication method includes: forming, over a first dielectric layer between a first metal portion and a second metal portion, a thin film resistor (TFR) with a ceramic coating over the TFR; forming openings in the first dielectric layer over the first metal portion and the second metal portion; and forming a first bond pad in an opening over the first metal portion and a second bond pad in an opening over the second metal portion; wherein the first dielectric layer is disposed between the first bond pad and the second bond pad and the TFR is formed over the first dielectric layer between the first bond pad and the second bond pad.

In certain embodiments of the method, wherein forming a TFR with a ceramic coating over the TFR includes: forming thin film resistive material over the first dielectric layer; forming a ceramic coating over the thin film resistive material; forming a patterned photo resist (PR) layer over a portion of the ceramic coating and thin film resistive material between the first metal portion and the second metal portion; patterning the thin film resistive material and the ceramic coating to form the TFR and a patterned ceramic coating overlying the TFR; and removing the PR layer.

In certain embodiments of the method, forming the first bond pad in the opening over the first metal portion and the second bond pad in the opening over the second metal portion includes: forming bond pad material over the first dielectric layer, the first metal portion and the second metal portion; and removing the bond pad material and the patterned ceramic coating overlying the TFR.

In certain embodiments of the method, removing the bond pad material and the patterned ceramic coating overlying the TFR includes: forming a patterned second PR that defines an opening above the TFR for removing bond pad material; performing dry etching operations to remove bond pad material above the TFR; performing wet etching operations to remove ceramic material above the TFR; and removing the second PR.

In certain embodiments of the method, forming openings in the first dielectric layer over the first metal portion and the second metal portion includes: forming a patterned third PR that defines openings in the first dielectric layer over the first metal portion and the second metal portion; performing dry etching operations to remove dielectric material above the first metal portion and the second metal portion; and removing the third PR.

In certain embodiments of the method, the first bond pad and the second bond pad each contain a ceramic layer and a metal layer that overlays the ceramic layer; and the TFR electrically connects at a first end to the first bond pad via the ceramic layer of the first bond pad and electrically connects at a second end to the second bond pad via the ceramic layer of the second bond pad.

In certain embodiments of the method, the TFR is formed from silicon chromium (SiCr), the ceramic layer is formed from titanium nitride (TiN), and the metal layer is formed from aluminum copper (AlCu).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing an interconnect structure overlying a substrate, the interconnect structure including a first metal portion and a second metal portion in a top layer of the interconnect structure;
    forming thin film resistive material over a first dielectric layer that overlays the top layer of the interconnect structure;
    forming a ceramic coating over the thin film resistive material;
    forming a patterned photo resist (PR) layer over a portion of the ceramic coating and thin film resistive material laterally disposed between the first metal portion and the second metal portion in the top layer of the interconnect structure;
    patterning the thin film resistive material and the ceramic coating to form a thin film resistor (TFR) and a patterned ceramic coating overlying the TFR laterally disposed between and vertically disposed above the first metal portion and the second metal portion;
    removing the patterned PR layer;
    forming openings in the first dielectric layer over the first metal portion and the second metal portion; and
    forming a first bond pad over the first metal portion and a second bond pad over the second metal portion by forming bond pad material comprising a ceramic layer and a metal layer over the first metal portion, the second metal portion, a first end of the TFR, and a second end of the TFR, wherein the first bond pad and the second bond pad are configured for use as test points or connection points for packaging connections;
    wherein the TFR electrically connects at the first end to the first bond pad via the ceramic layer of the first bond pad and electrically connects at the second end to the second bond pad via the ceramic layer of the second bond pad.

2. The method of claim 1, wherein the TFR is positioned higher than bottoms of the first bond pad and the second bond pad.

3. The method of claim 1, wherein the TFR is formed from silicon chromium (SiCr), the ceramic layer is formed from titanium nitride (TiN) and the metal layer is formed from aluminum copper (AlCu).

4. The method of claim 1, further comprising forming a second dielectric layer above the TFR and the first dielectric layer.

5. The method of claim 1, wherein forming the first bond pad over the first metal portion and the second bond pad over the second metal portion comprises removing a portion of the bond pad material and the ceramic coating overlying the TFR by:
    forming a patterned second PR layer that defines an opening above the TFR for removing bond pad material;
    performing dry etching operations to remove bond pad material above the TFR;
    performing wet etching operations to remove ceramic material above the TFR; and
    removing the patterned second PR layer.

6. The method of claim 1, wherein forming openings in the first dielectric layer over the first metal portion and the second metal portion comprises:
    forming a patterned third PR layer that defines openings in the first dielectric layer over the first metal portion and the second metal portion;
    performing dry etching operations to remove dielectric material above the first metal portion and the second metal portion; and
    removing the patterned third PR layer.

7. The method of claim 1, wherein forming the TFR with the first bond pad formed over the first end of the TFR and the second bond pad formed over the second end of the TFR comprises forming the TFR using a single mask.

8. A method comprising:
    providing an interconnect structure overlying a substrate and a first dielectric layer overlying the interconnect structure, the interconnect structure including a first metal portion and a second metal portion in a top layer of the interconnect structure;

forming, over the first dielectric layer and laterally between the first metal portion and the second metal portion, a thin film resistor (TFR) with a ceramic coating over the TFR;

forming openings in the first dielectric layer over the first metal portion and the second metal portion; and forming a first bond pad in an opening over the first metal portion and a second bond pad in an opening over the second metal portion, wherein the first bond pad and the second bond pad comprise a ceramic layer and a metal layer over the first metal portion, the second metal portion, a first end of the TFR, and a second end of the TFR, wherein the first bond pad and the second bond pad are configured for use as test points or connection points for packaging connections;

wherein the TFR electrically connects at the first end to the first bond pad via the ceramic layer of the first bond pad and electrically connects at the second end to the second bond pad via the ceramic layer of the second bond pad.

9. The method of claim 8, wherein forming a TFR with a ceramic coating over the TFR, comprises:

forming thin film resistive material over the first dielectric layer;

forming a ceramic coating over the thin film resistive material;

forming a patterned photo resist (PR) layer over a portion of the ceramic coating and thin film resistive material between the first metal portion and the second metal portion;

patterning the thin film resistive material and the ceramic coating to form the TFR and a patterned ceramic coating overlying the TFR; and removing the patterned PR layer.

10. The method of claim 9, wherein forming the first bond pad in the opening over the first metal portion and the second bond pad in the opening over the second metal portion comprises:

forming bond pad material over the first dielectric layer, the first metal portion and the second metal portion; and removing the bond pad material and the patterned ceramic coating overlying the TFR.

11. The method of claim 10, wherein removing the bond pad material and the patterned ceramic coating overlying the TFR comprises:

forming a patterned second PR layer that defines an opening above the TFR for removing bond pad material;

performing dry etching operations to remove bond pad material above the TFR;

performing wet etching operations to remove ceramic material above the TFR; and removing the patterned second PR layer.

12. The method of claim 9, wherein forming openings in the first dielectric layer over the first metal portion and the second metal portion comprises:

forming a patterned third PR layer that defines openings in the first dielectric layer over the first metal portion and the second metal portion;

performing dry etching operations to remove dielectric material above the first metal portion and the second metal portion; and removing the patterned third PR layer.

13. The method of claim 9, wherein: the TFR is formed from silicon chromium (SiCr), the ceramic layer is formed from titanium nitride (TiN), and the metal layer is formed from aluminum copper (AlCu).

14. The method of claim 8, wherein forming the TFR with the first bond pad formed over the first end of the TFR and the second bond pad formed over the second end of the TFR comprises forming the TFR using a single mask.

15. A method comprising:

providing a substrate with an interconnect structure overlying the substrate, the interconnect structure including a first metal portion and a second metal portion in a top layer of the interconnect structure;

providing a first dielectric layer above the interconnect structure;

forming a thin film resistor (TFR) over the first dielectric layer between the first metal portion and the second metal portion;

forming a first opening in the first dielectric layer on a first side of the TFR and a second opening in the first dielectric layer on a second side of the TFR;

forming a first bond pad in the first opening over the first metal portion; and forming a second bond pad in the second opening over the second metal portion;

wherein the first bond pad and the second bond pad comprise a ceramic layer and a metal layer over the first metal portion, the second metal portion, a first end of the TFR, and a second end of the TFR, wherein the first bond pad and the second bond pad are configured for use as test points or connection points for packaging connections;

wherein the TFR electrically connects at the first end to the first bond pad via the ceramic layer of the first bond pad and electrically connects at the second end to the second bond pad via the ceramic layer of the second bond pad.

16. The method of claim 15, wherein the TFR is positioned higher than bottoms of the first bond pad and the second bond pad.

17. The method of claim 15, wherein the TFR is formed from silicon chromium (SiCr), the ceramic layer is formed from titanium nitride (TiN), and the metal layer is formed from aluminum copper (AlCu).

18. The method of claim 15, wherein forming the thin film resistor (TFR) comprises:

forming thin film resistive material over the first dielectric layer;

forming a ceramic coating over the thin film resistive material;

forming a patterned photo resist (PR) layer over a portion of the ceramic coating and thin film resistive material between the first metal portion and the second metal portion;

patterning the thin film resistive material and the ceramic coating; and removing the patterned PR layer.

19. The method of claim 15, wherein forming the first bond pad and forming the second bond pad comprises forming the first bond pad over a first end of the TFR and forming the second bond pad over a second end of the TFR.

20. The method of claim 15, wherein forming the TFR with the first bond pad formed over the first end of the TFR and the second bond pad formed over the second end of the TFR comprises forming the TFR using a single mask.

* * * * *